(12) United States Patent
Yan et al.

(10) Patent No.: US 12,336,364 B2
(45) Date of Patent: Jun. 17, 2025

(54) PEROVSKITE WITH MODIFIED SURFACE AND METHOD FOR MAKING THE SAME

(71) Applicant: The Hong Kong Polytechnic University, Hong Kong (CN)

(72) Inventors: Feng Yan, Hong Kong (CN); Jing Zhuang, Hong Kong (CN)

(73) Assignee: The Hong Kong Polytechnic University, Hong Kong (CN)

( * ) Notice: Subject to any disclaimer, the term of this patent is extended or adjusted under 35 U.S.C. 154(b) by 11 days.

(21) Appl. No.: 18/243,110

(22) Filed: Sep. 7, 2023

(65) Prior Publication Data

US 2025/0089431 A1    Mar. 13, 2025

(51) Int. Cl.
  *H10K 30/50*    (2023.01)
  *H10K 71/12*    (2023.01)
  *H10K 85/50*    (2023.01)

(52) U.S. Cl.
  CPC ............. *H10K 30/50* (2023.02); *H10K 71/12* (2023.02); *H10K 85/50* (2023.02)

(58) Field of Classification Search
  CPC ........ H10K 30/00–89; H10K 39/00–18; H10F 10/00–19; H10F 19/00–908
  USPC .................................................. 136/243–265
  See application file for complete search history.

(56) References Cited

PUBLICATIONS

Li et al., Efficient and Spectrally Stable Blue Light-Emitting Diodes Based on Diphenylguanidine Bromide Passivated Mixed-Halide Perovskites, ACS Appl. Electron. Mater., 2021, 3, 4912-4918. (Year: 2021).*

* cited by examiner

*Primary Examiner* — Bach T Dinh
(74) *Attorney, Agent, or Firm* — Law Offices of Albert Wai-Kit Chan, PLLC

(57) ABSTRACT

This invention provides a perovskite with a modified surface and method for making the same. In one embodiment, said perovskite is a mixed-cation lead halide perovskite; and said modified surface comprises a DPGABr:PbI$_2$ complex layer. In one embodiment, said method for manufacturing a perovskite with a modified surface, comprises the steps of: a) Providing a perovskite with a surface to be modified; b) Treating said surface to be modified with DPGABr; and c) Annealing to form said perovskite with a modified surface.

19 Claims, 15 Drawing Sheets

PEROVSKITE WITH MODIFIED SURFACE AND METHOD FOR MAKING THE SAME

FIELD OF THE INVENTION

The present invention relates to solar cells, particularly, perovskite solar cells.

BACKGROUND OF THE INVENTION

In recent years, metal halide perovskite solar cells (PSCs) have gained significant attention in both scientific research and industrial efforts within the photovoltaic community, due to their skyrocketed increase in power conversion efficiency (PCE) [1-5]. Blade-coating in air is a promising technique for scalable and cost-effective fabrication of PSCs [6, 7]. At the early stage, researchers were focusing on the operation conditions of blade coating, including substrate temperature [8], flow speed and direction of $N_2$ knife [9], and air humidity [10]. Then more strategies, such as solvent engineering and additives engineering [11, 12], have successfully facilitated the production of high-quality and large-area perovskite films. Notably, in comparison with ordered crystal structure in the bulk, atoms at the perovskite surface are more vulnerable to environment during crystallization. The environmental factors, such as humidity [13-15], temperature [16, 17] and atmosphere [18], can influence the crystal lattice and perturb the atomic periodicity on the surface. Therefore, the surface of blade-coated perovskite film, which closely involves charge trapping, carrier recombination, charge transfer, and ion diffusion, plays a crucial role in the performance of PSCs [19-21].

Much efforts have been devoted to improving the surface quality of perovskite films by surface treatments, such as surface modification or surface reconstruction [22, 23]. Typically, surface modification involves the optimization of the chemical or physical properties of perovskite's surface without changing its bulk properties, which is often achieved by introducing small molecule/polymer treatment [24, 25](e.g. lewis base/acid) or physical modification (such as mechanical peel-off of the defective layer [26]). These processes can enhance the quality of perovskite surface with decreased defect density. On the other hand, surface reconstruction is a spontaneous process that typically occurs when introducing molecules on the perovskite surface to react and form a new and more stable structure. The $PbI_2$-termination or MAI-termination of perovskite films serve as a foundation for surface reconstruction at the molecular level, stimulating the physical and chemical alteration of the film surface [27]. For example, Wu et. al introduce FAI on the $MAPbI_3$ surface to spontaneously form $FAPbI_3$ through reacting with $PbI_2$ termination by immersing blade-coated $MAPbI_3$ into a hot bath of FAI. This surface reconstruction can effectively reduce surface defect density and promote charge transport at a perovskite surface. However, it is challenging to achieve surface reconstratution during blade-coating because the retention time is estimated to be only several milliseconds [6][28]. Therefore, choosing suitable solvents and modifiers for post-treatment is crucial in achieving effective surface reconstruction of perovskite through blade coating.

SUMMARY OF THE INVENTION

This invention provides a perovskite with a modified surface. In one embodiment, said perovskite is a mixed-cation lead halide perovskite; and said modified surface comprises a $DPGABr:PbI_2$ complex layer.

This invention also provides a perovskite solar cell, comprising the perovskite of this invention.

This invention further provides a method for manufacturing a perovskite with a modified surface. In one embodiment, said method comprises the steps of: a) Providing a perovskite with a surface to be modified; b) Treating said surface to be modified with DPGABr; and c) Annealing to form said perovskite with a modified surface.

DETAILED DESCRIPTION OF THE INVENTION

Figure 1:
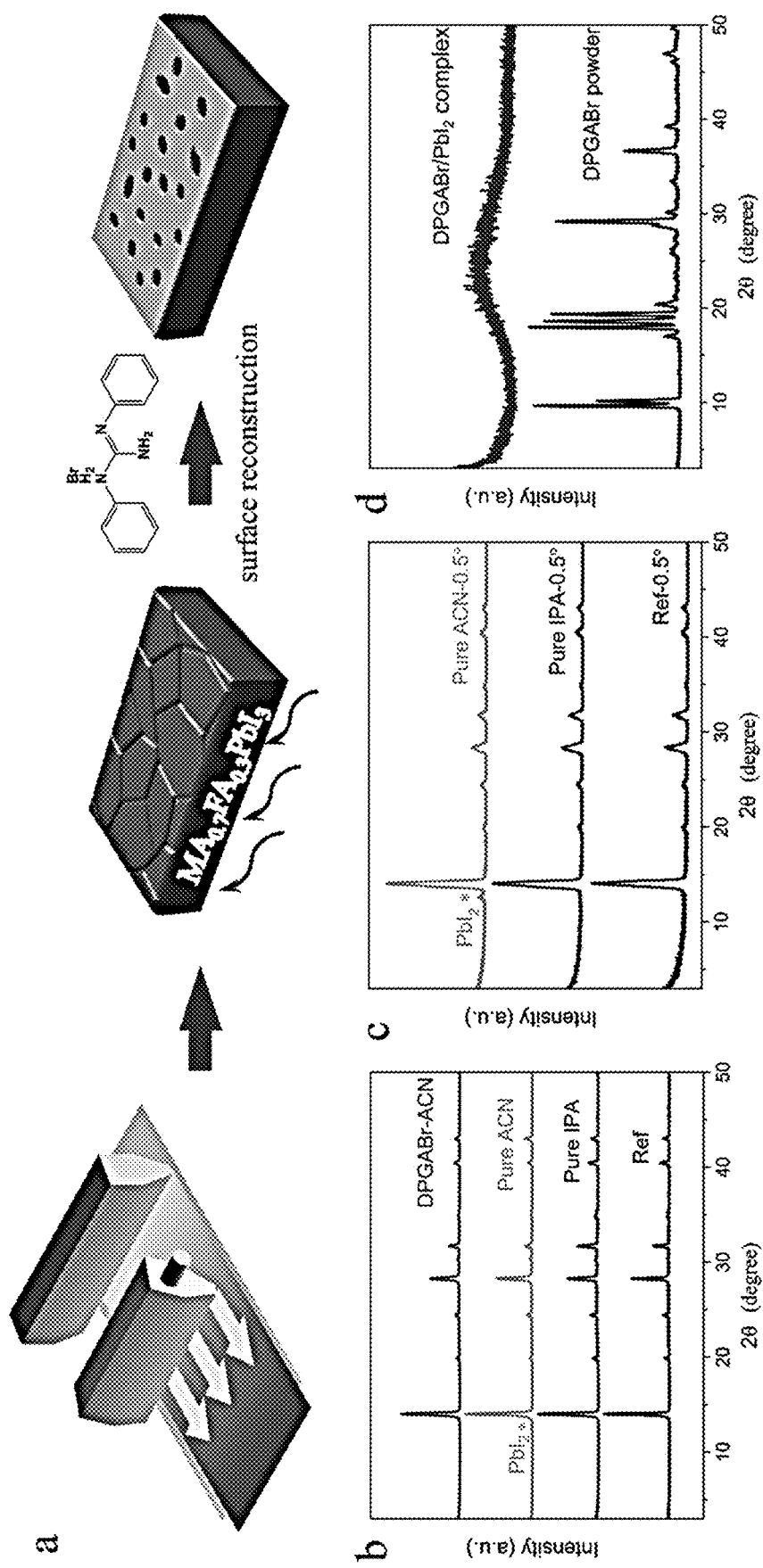
FIG. 1 shows (a) Schematic illustration of the surface reconstructure of $MA_{0.7}FA_{0.3}PbI_3$ films by blade coating and with DPGABr treatment. (b) XRD patterns of perovskite films with or without post-treatment. (c) GIXRD diffraction patterns of the reference perovskite, pure IPA treated film, and pure ACN treated film measured with an incident angle of $\omega=0.5°$. (d) XRD patterns of DPGABr powder and $[DPGABr]_2PbI_2$.

This invention provides a perovskite with a modified surface. In one embodiment, said perovskite is a mixed-cation lead halide perovskite; and said modified surface comprises a DPGABr:PbI$_2$ complex layer.

In one embodiment, said perovskite comprises $MA_{(1-x)}FA_xPbI_3$ with $0 \leq x \leq 1$.

In one embodiment, said perovskite comprises one or more selected from the group consisting of $MA_{0.7}FA_{0.3}PbI_3$, $MAPbI_3$ and $FAPbI_3$ In one embodiment, said modified surface exhibits one or more photovoltaic properties selecting from the group consisting of a) a PCE of >20%; b) a Voc of >1.1V; c) a Jsc of >23 mA cm$^{-2}$; and d) a fill factor of >75%. In another embodiment, said modified surface exhibits one or more photovoltaic properties selecting from the group consisting of: a) a PCE of 21.82±1.55%; b) a $V_{oc}$ of 1.154±0.02V; c) a $J_{sc}$ of 24.30±0.55 mA cm$^{-2}$; and d) a fill factor of 78.42±1.69%.

In one embodiment, said modified surface is n-type as compared to an unmodified surface of said perovskite.

In one embodiment, said modified surface is formed by the steps comprising: a) Providing a perovskite with a surface to be modified; b) Treating said surface to be modified with DPGABr; and c) Annealing to form said perovskite with a modified surface.

This invention also provides a perovskite solar cell, comprising the perovskite of this invention.

In one embodiment, said perovskite solar cell comprises a structure of ITO/PTAA/perovskite of claim 1/PC70BM/BCP/Ag.

This invention further provides a method for manufacturing a perovskite with a modified surface. In one embodiment, said method comprises the steps of: a) Providing a perovskite with a surface to be modified; b) Treating said surface to be modified with DPGABr; and c) Annealing to form said perovskite with a modified surface.

In one embodiment, said step (a) comprises blade coating a perovskite solution onto a surface.

In one embodiment, said perovskite solution comprises $MA_{(1-x)}FA_xPbI_3$ with $0 \leq x \leq 1$.

In one embodiment, said perovskite solution comprises a $MA_{0.7}FA_{0.3}PbI_3$ solution.

In one embodiment, said $MA_{0.7}FA_{0.3}PbI_3$ solution is a 1.37 M $MA_{0.7}FA_{0.3}PbI_3$ solution formed by mixing of 2.5 M MAPbI$_3$ and 1.67 M FAPbI$_3$ followed by diluting.

In one embodiment, said $MA_{0.7}FA_{0.3}PbI_3$ solution further comprises 1.84 mg ml$^{-1}$ MACl, 1.15 mg ml$^{-1}$ MABr, and 2.8% v/v DMSO.

In one embodiment, said surface is PTAA and said blade coating is conducted with a gap of 200 μm at a speed of 20 mm s$^{-1}$.

In one embodiment, said step (b) comprises blade coating a DPGABr solution on said surface to be modified.

In one embodiment, said DPGABr solution comprises DPGABr dissolved in ACN.

In one embodiment, said DPGABr solution has a concentration of 0.25-1.0 mg/ml.

In one embodiment, said step (c) comprises annealing at 100-120° C.

The invention will be better understood by reference to the following examples, but those skilled in the art will readily appreciate that the specific examples detailed are only illustrative, and are not meant to limit the invention as described herein, which is defined by the claims which follow thereafter. Throughout this application, various references or publications are cited. Disclosures of these references or publications in their entireties are hereby incorporated by reference into this application in order to more fully describe the state of the art to which this invention pertains. It is to be noted that the transitional term "comprising", which is synonymous with "including", "containing" or "characterized by", is inclusive or open-ended and does not exclude additional, un-recited elements or method steps.

EXAMPLE

Experimental Section

In this study, the impact of solvents such as isopropanol (IPA) and acetonitrile (ACN) for the post treatment of mixed perovskite $MA_{0.7}FA_{0.3}PbI_3$ on its surface by blade coating is examined. It was found that ACN can partially remove MAI/FAI and expose PbI$_2$ termination on the surface, whereas IPA has negligible impact on the surface, indicating that ACN is a suitable solvent for further surface reconstruction. A novel surface modifier, N,N-diphenylguanidine monohydrobromide (DPGABr), was then introduced to reconstruct the perovskite film surface. The results reveal that this treatment can substantially enhance the photovoltaic performance due to an effective surface reconstruction on the perovskite layer. It was found that an ultrathin complex layer of DPGABr/PbI$_2$ is formed on the perovskite surface, which significantly reduces nonradiative recombination and facilitates electron transfer due to the modulation of Fermi energy on the surface. Based on this technique, blade-coated inverted PSCs achieved a champion PCE of 23.37%, an open-circuit voltage ($V_{oc}$) of 1.174V and excellent long-term stability, with a relative enhancement of 6% in the average PCE in comparison with the control devices.

Materials: Lead iodide (99.99%) (PbI$_2$) and N,N-Diphenylguanidine Monohydrobromide (DPGABr) was obtained from Alfa Aesar. Formamidinium iodide (99.99%) (FAI) and methylammonium iodide (99.99%) (MAI) were purchased from Greatcell solar materials. 2-methoxy-ethanol (2ME), chlorobenzene (CB), isopropanol (IPA), toluene, and dimethyl sulfoxide (DMSO) were purchased from Sigma-Aldrich. Poly[bis(4-phenyl) (2,4,6-trimethylphenyl) amine] (Mn=15000-25000) (PTAA) and 2,9-dimethyl-4,7-diphenyl-1,10-phenanthroline (96%) (BCP) were purchased from Xi'an Polymer Light Technology Corp. Phenyl-C71-butyric acid methyl ester (99%) (PC70BM) was purchased from Nano-C.

Solar cells Fabrication: The ITO glasses were ultrasonically cleaned with deionized water, acetone and isopropanol for 15 minutes, respectively. Then the clean glasses were dried with nitrogen and then treated with oxygen plasma for 10 minutes. The PTAA layer with a concentration of 2 mg ml$^{-1}$ dissolved in toluene was spin-coated onto ITO glass substrates at 5000 rpm for 30 s and then annealed at 100° C. for 10 min. Before blade coating, the precursor solutions (2.5 M MAPbI$_3$ and 1.67 M FAPbI$_3$) were mixed and diluted to a 1.37 M MA$_{0.7}$FA$_{0.3}$PbI$_3$ solution, and MACl (1.84 mg ml$^{-1}$), MABr (1.15 mg ml$^{-1}$), and 2.8% (v/v) DMSO were added into the precursor solution as additives. Next, MA$_{0.7}$FA$_{0.3}$PbI$_3$ solution was blade-coated onto the PTAA surface with a gap of 200 μm at a speed of 20 mm s$^{-1}$ and annealed at 105° C. for 10 min. Perovskite films treated with DPGABr were subjected to blade-coating with varying concentrations of DPGABr dissolved in IPA or CAN, followed by annealing at 105° C. for 5 minutes. 20 mg mL$^{-1}$ PCBM dissolved in CB was spin-coated at 1500 rpm for 60 s and annealed at 60° C. for 5 min. Then 0.5 mg mL$^{-1}$ BCP dissolved in IPA was spin-coated at 4500 rpm for 30 s. Finally, 200 nm Ag film was deposited as electrode by thermal evaporation.

Characterization: XPS was measured by XPS machine (ESCALAB250XI, Thermo Fisher Scientific). The X-ray diffraction patterns were measured by using a Rigaku-2500 X-ray diffractometer with an X-ray tube (Cu Kα, λ=1.5406 Å). The top-view and cross-sectional SEM images were attained using a scanning electron microscope (Tescan MAIA3). EQE was recorded using a Newport Oriel QE-200 by a power source (Newport 300 W xenon lamp, 66920) with a monochromatic instrument (Newport Cornerstone 260). All J-V curves were measured using a source meter (Keithley 2400, USA) under AM 1.5 sunlight at an irradiance of 100 mW cm$^{-2}$ provided by a solar simulator (Newport 66902). Light intensity was calibrated using a monocrystalline silicon reference cell with a KG5 window (Newport, Oriel 91150). Impedance spectroscopy (IS) was measured by Zennium (Zahner). PL was measured by the FLS 920 (Edinburgh Instruments, Ltd).

DFT calculations: The DFT simulations were carried out using Quantum Espresso (ver. 6.5). Prior to the DOS and charge density calculations, all structures were fully relaxed using the Perdew, Burke, and Ernzerhof (PBE) exchange correlation functionals and the projector augmented wave (PAW) method. The electronic convergence criterion was set to 1×10$^{-6}$ eV, and a plane wave basis set with a cut-off energy of 450 eV was employed.

Results and Discussion

Solvent Effect on the Surface of MA$_{0.7}$FA$_{0.3}$PbI$_3$ by Blade Coating

The perovskite films with the component of MA$_{0.7}$FA$_{0.3}$PbI$_3$ were prepared by blade coating in air and subsequently thermally annealed at 105° C. for 15 mins in air (see FIG. 1a). Then the films were coated with different solvents including ACN and IPA by blade coating because these solvents can only dissolve 3D perovskite slowly on the surface [29]. The resultant films were characterized using X-ray diffraction (XRD). As shown in FIG. 1b, the primary peaks of all films can be attributed to the reflection of MA$_{0.7}$FA$_{0.3}$PbI$_3$. It is noteworthy that a [001] peak for PbI$_2$ crystal at 12.5° was observed in the sample treated with ACN solvent, indicating that the MAI/FAI on the perovskite surface was initially dissolved in ACN during the rapid dynamic process, with PbI$_2$ termination forming on the surface. However, IPA-treated MA$_{0.7}$FA$_{0.3}$PbI$_3$ did not show PbI$_2$ phase after the blade coating process, which can be attributed to the lower solubility of MAI/FAI in IPA compared to ACN. During the blade coating process, the trace amount of IPA and instantaneous exposure on the perovskite surface make it difficult to dissolve MAI or FAI. The films were then characterized by grazing incidence XRD (GIXRD). The peak of PbI$_2$ was directly detected in the pure ACN-treated films at an incident angle of 0.5° (FIG. 1c). In addition, the peak intensity ratio of PbI$_2$:MA$_{0.7}$FA$_{0.3}$PbI$_3$ decreases when the incidence angle is increased to 1° (FIG. 2), indicating that PbI$_2$ is mainly located on the perovskite surface. In contrast, no new peaks were observed in pure IPA-treated films under the same characterization conditions, further confirming that pure IPA treatment cannot induce PbI$_2$ on the perovskite surface.

Figure 3:
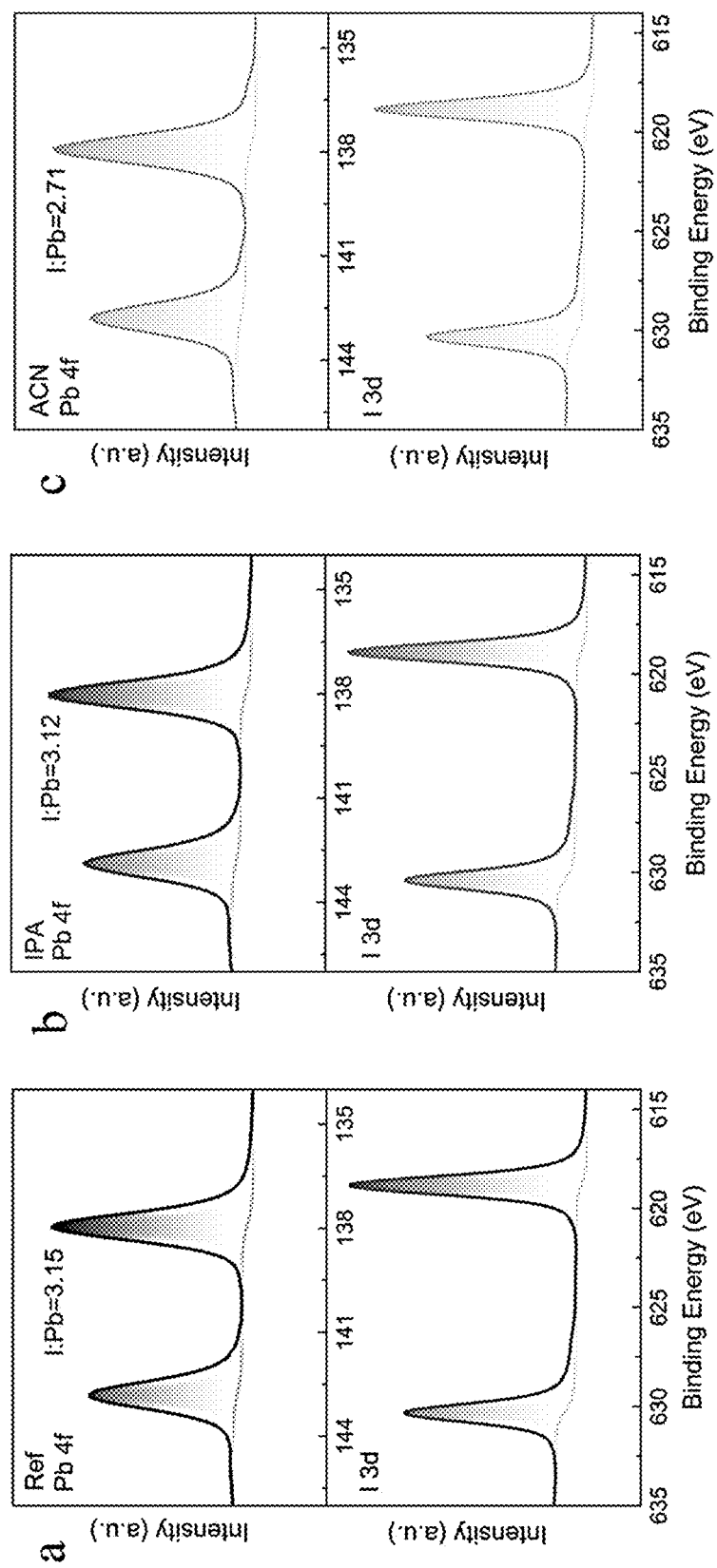
FIG. 3 shows XPS spectra of the Pb 4f and I 3d peaks of the perovskite films, inset is the calculated I:Pb ratio of the films: (a) reference perovskite, (b) pure IPA treated perovskite, and (c) pure ACN treated perovskite.

X-ray photoelectron spectroscopy (XPS) spectra of the pristine perovskite film or the films treated with ACN or IPA are shown in FIG. 3a-c, The XPS core-level energy spectra of Pb 4f for the control perovskite film show two main peaks at 138.79 and 143.73 eV, corresponding to the Pb 4f7/2 and Pb 4f5/2. The I:Pb ratio can be calculated from the integrated areas of I 3d and Pb 4f peaks. A decline in the I:Pb ratio from 3.15 to 2.71 after the pure ACN post-treatment was observed, confirming the appearance of the PbI$_2$ termination on the surface due to the limited detection depth. However, the I:Pb ratio of both the pristine film or the IPA-treated films remained unchanged, indicating again that IPA treatment does not have any significant impact on the surface component or chemical characteristics of MA$_{0.7}$FA$_{0.3}$PbI$_3$ during the blade coating process.

Surface Reconstruction of MA$_{0.7}$FA$_{0.3}$PbI$_3$ by DPGABr

Figure 2:
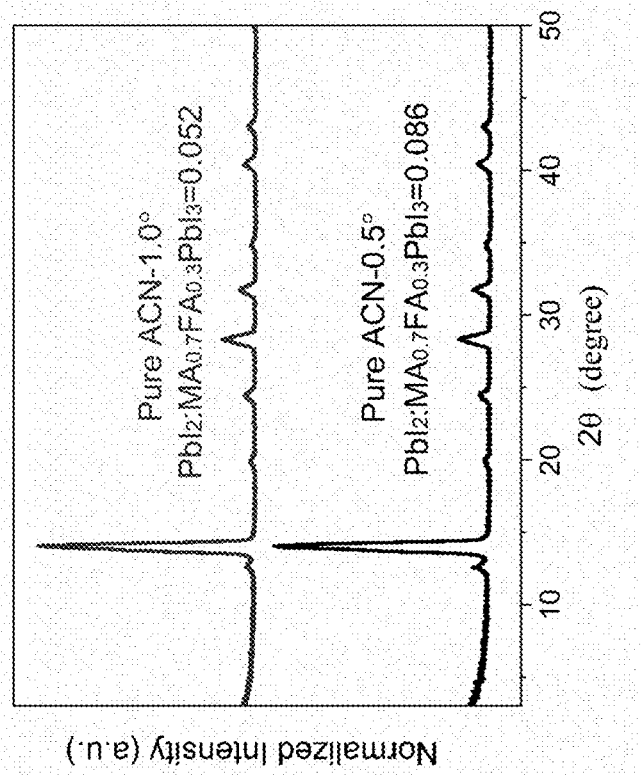
FIG. 2 shows GIXRD diffraction patterns of pure ACN treated film measured with an incident angle of $\omega=0.5°$ or $1.0°$.

As presented in FIG. 1b, although the perovskite film treated with pure ACN shows the [001] peak for PbI$_2$, the film blade-coated with the solution of DPGABr dissolved in ACN does not show the PbI$_2$ peak, indicating that DPGABr can interact with PbI$_2$ and generate another phase. To study their interaction, mixture of DPGABr and PbI$_2$ were dissolved in dimethyl sulfoxide (DMSO) and deposited on a glass substrate with thermal annealing at 120° C. for 10 min to form a solid film, which was then characterized under XRD, as shown in FIG. 1d. The broad peak for the mixture film indicates that DPGABr and PbI$_2$ can form an amorphous complex. Based on the experimental results, a surface reconstruction process is proposed wherein the use of ACN as the solvent rapidly dissolves a significant amount of MAI/FAI to expose PbI$_2$ and then DPGABr interacts with PbI$_2$ to form a DPGABr:PbI$_2$ complex.

Figure 4:
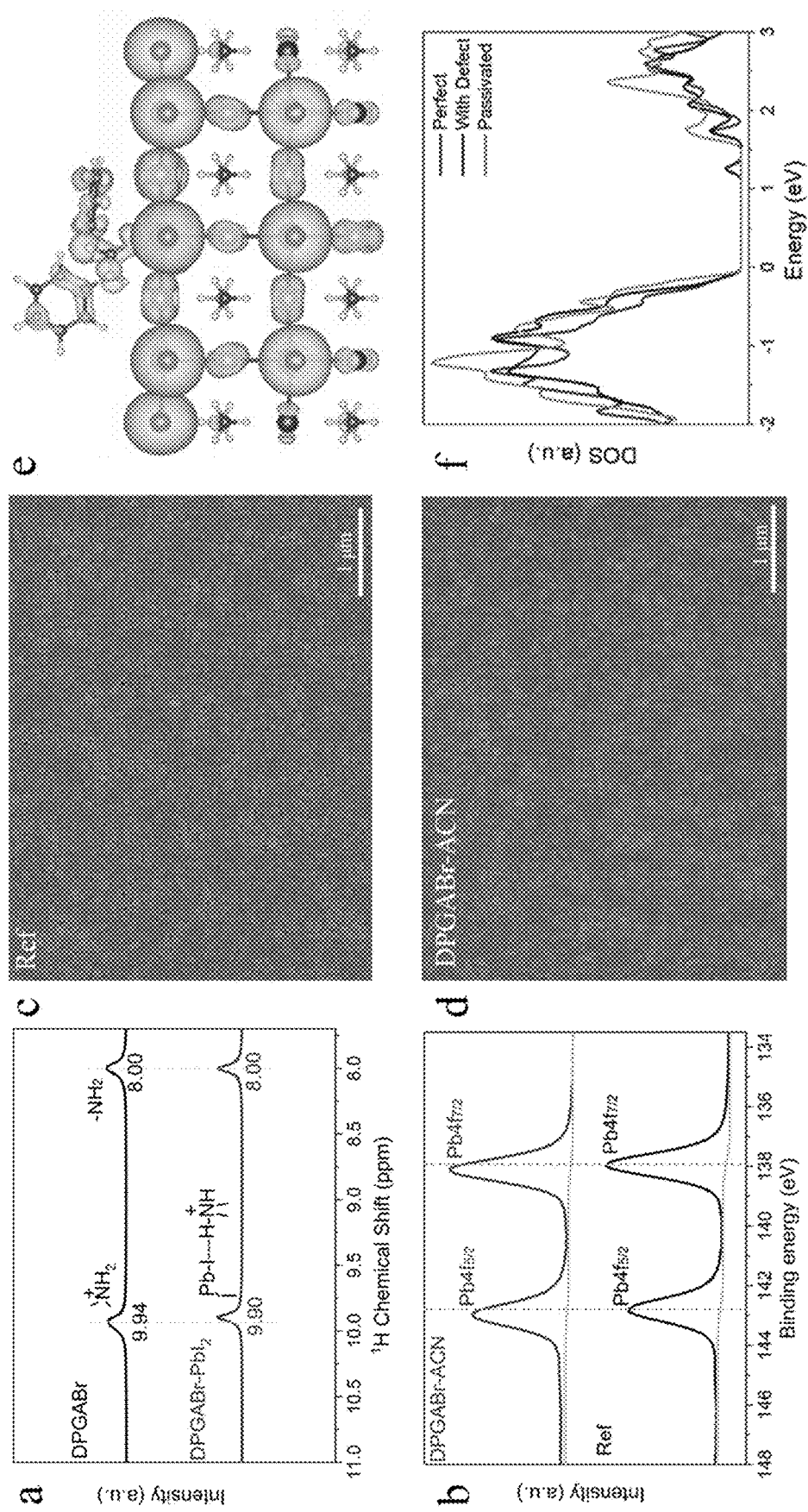
FIG. 4 shows (a)$^1$H-NMR spectra of neat DPGABr and DPGABr+$PbI_2$ compounds. TOF-SIMS profiles of the perovskite films with (b) Pb4f spectra of reference and DPGABr-ACN treated films. Top-surface SEM images of (c) reference perovskite films, (d) DPGABr-ACN treated film. (e) Simulated charge density distribution of $MAPbI_3$ with a $Pb_I$ (I substituted by Pb) antisite defect passivated by DPGABr. (f) DOS of pristine $MAPbI_3$, $MAPbI_3$ with a $Pb_I$ antisite defect, and $MAPbI_3$ with a $Pb_I$ antisite defect passivated by DPGABr.

To gain further insight into the interaction between DPGABr molecules and PbI$_2$, nuclear magnetic resonance (NMR) measurement was conducted on the solutions of DPGABr or DPGABr+PbI$_2$ (1:1) dissolved in d6-dimethyl sulfoxide (d-DMSO) solvent. As shown in FIG. 4a, the NMR analysis revealed that the $^1$H resonance signals at 9.94 and 8.00 ppm, which correspond to the —NH$_2^+$— and —NH$_2$ environments of neat DPGABr [30, 31]. For the DPGABr:PbI$_2$ mixture, $^1$H resonance signals of —NH$_2^+$— shifted to 9.90 ppm and that of —NH$_2$ remain unchanged, suggesting the formation of hydrogen bonds between —NH$_2^+$— and I—Pb—I in the solvent [32]. Then the perovskite films before and after the DPGABr-ACN solution treatment were characterized by XPS. As shown in FIG. 4b, the characteristic peaks of Pb 4f in the XPS spectra were found to shift to higher binding energy from 137.90 to 137.98 eV after the DPGABr-ACN treatment, indicating the altered chemical environment of Pb and thus the formation of a new phase on perovskite surface [33]. These results all suggests that DPGABr can interact with $PbI_2$ induced by ACN coating and generate a thin complex on the perovskite surface.

Figure 5:
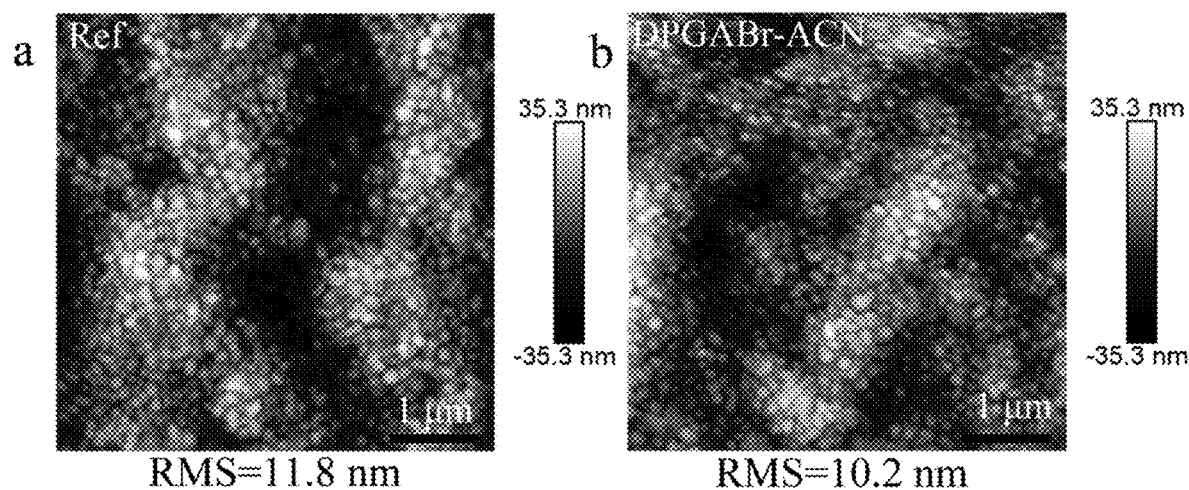
FIG. 5 shows atomic force microscopy (AFM) images of the perovskite films with and without surface treatment.

Scanning electron microscopy (SEM) images of $MA_{0.7}FA_{0.3}PbI_3$ with and without DPGABr-ACN post-treatments are shown in FIG. 4c-d. Notably, the perovskite surface treated with DPGABr-ACN exhibited a more smooth and compact morphology compared to the reference film, as evidenced by the lower surface roughness observed in atomic force microscopy (AFM) images (FIG. 5). These results indicates that that surface reconstruction was achieved successfully through DPGABr-ACN post-treatment.

Figure 6:
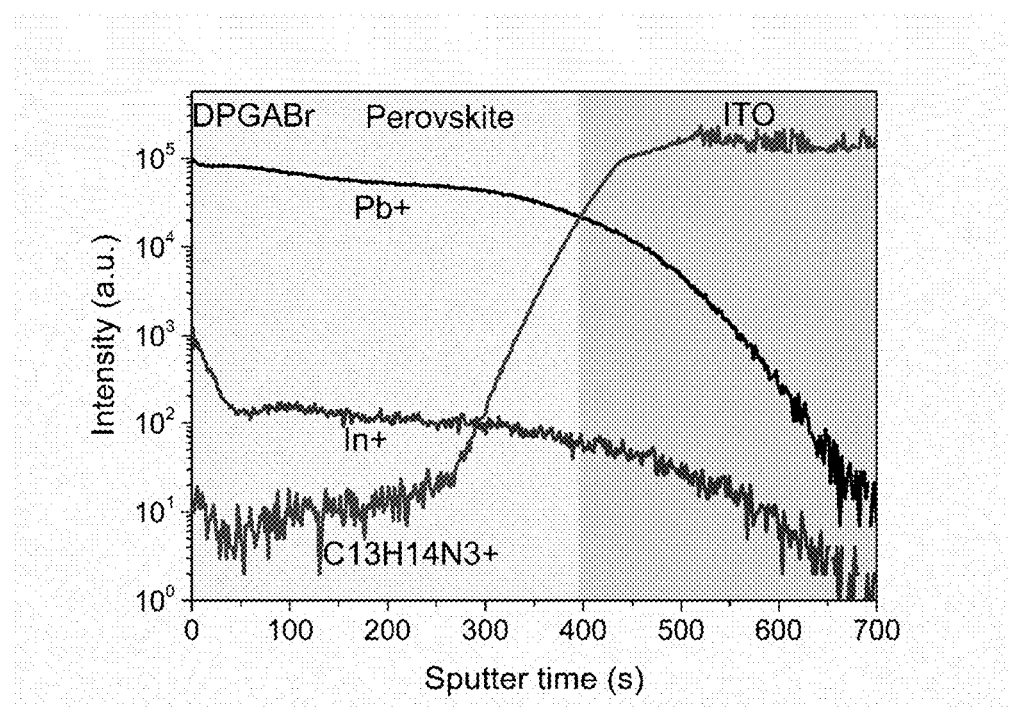
FIG. 6 shows TOF-SIMS profiles of the perovskite films with DPGABr-ACN post-treatment.

To explore whether DPGABr can penetrate into the perovskite layer, time-of-flight secondary ion mass spectrometry (TOF-SIMS) was employed to detect the vertical distribution of DPGA+ ions. As illustrated in FIG. 6, the depth profile of DPGA+ decreases rapidly on the surface when monitoring the molecular ion ($C_{13}H_{14}N_3+$) in positive mode. This observation indicates that DPGABr only permeates to a very shallow depth and is mainly localized on the perovskite surface. This limited penetration may be attributed to the short retention time of DPGABr solution on perovskite films. The intensity of $DPGA^+$ is two orders of magnitude lower than the intensity of $Pb^+$, suggesting that DPGABr only partially covers the film surface.

Figure 7:
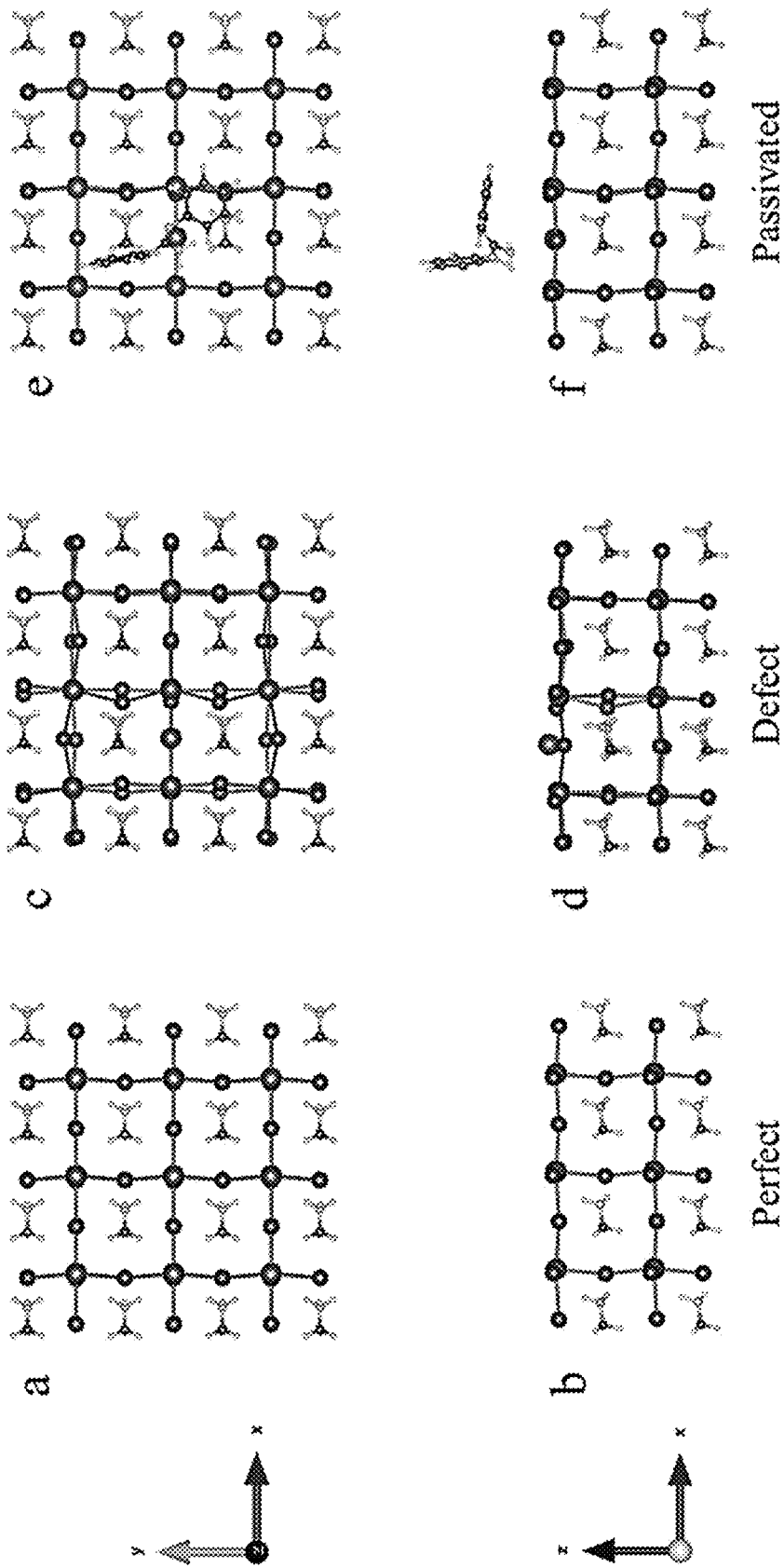
FIG. 7 shows DFT calculations for different perovskite supercells of (a, b) perfect $MAPbI_3$, (c, d) $MAPbI_3$ with a $Pb_I$ antisite defect and (e, f) $MAPbI_3$ with a $Pb_I$ antisite defect passivated by DPGABr.

Density-functional theory (DFT) calculations were employed to investigate the surface properties of films after surface reconstruction. To simplify the calculation while preserving generality, a cell of the $MAPbI_3$ perovskite with the $PbI_2$ termination was constructed. It is well-known that the band edges of organic-inorganic perovskites are dominated by the orbitals of Pb and I, which are critical to the band structure and closely involve the defects in the cells. Antisite defects related to these ions are known to be located at deep levels of the bandgap, acting as carrier recombination centres that reduce carrier lifetime [34-36]. As a Lewis base, the electron pair of N element in DPGABr enables effective passivation of antisite defects due to the coordination bonding with $Pb^{2+}$, which is also considered as the main interaction in the present case [35]. FIG. 7 displays the perovskite supercells with DPGABr passivated defects, providing visual evidence of the coordination bonding between N element in DPGABr and $Pb^{2+}$ at the film surface. To further elucidate the effects of DPGABr passivation, the density of states (DOS) of pristine $MAPbI_3$, $MAPbI_3$ with a $Pb_I$ antisite defect, and $MAPbI_3$ with a $Pb_I$ antisite defect passivated by DPGABr are simulated and presented in FIG. 4f. The calculation shows that $Pb_I$ antisite defects induce midgap trap states, but after DPGABr passivation, these trap states are shifted towards the conduction band edge. As such, it was concluded that DPGABr passivates the $Pb_I$ antisite defects, effectively reducing the number of carrier nonradiative recombination centers.

Figure 8:
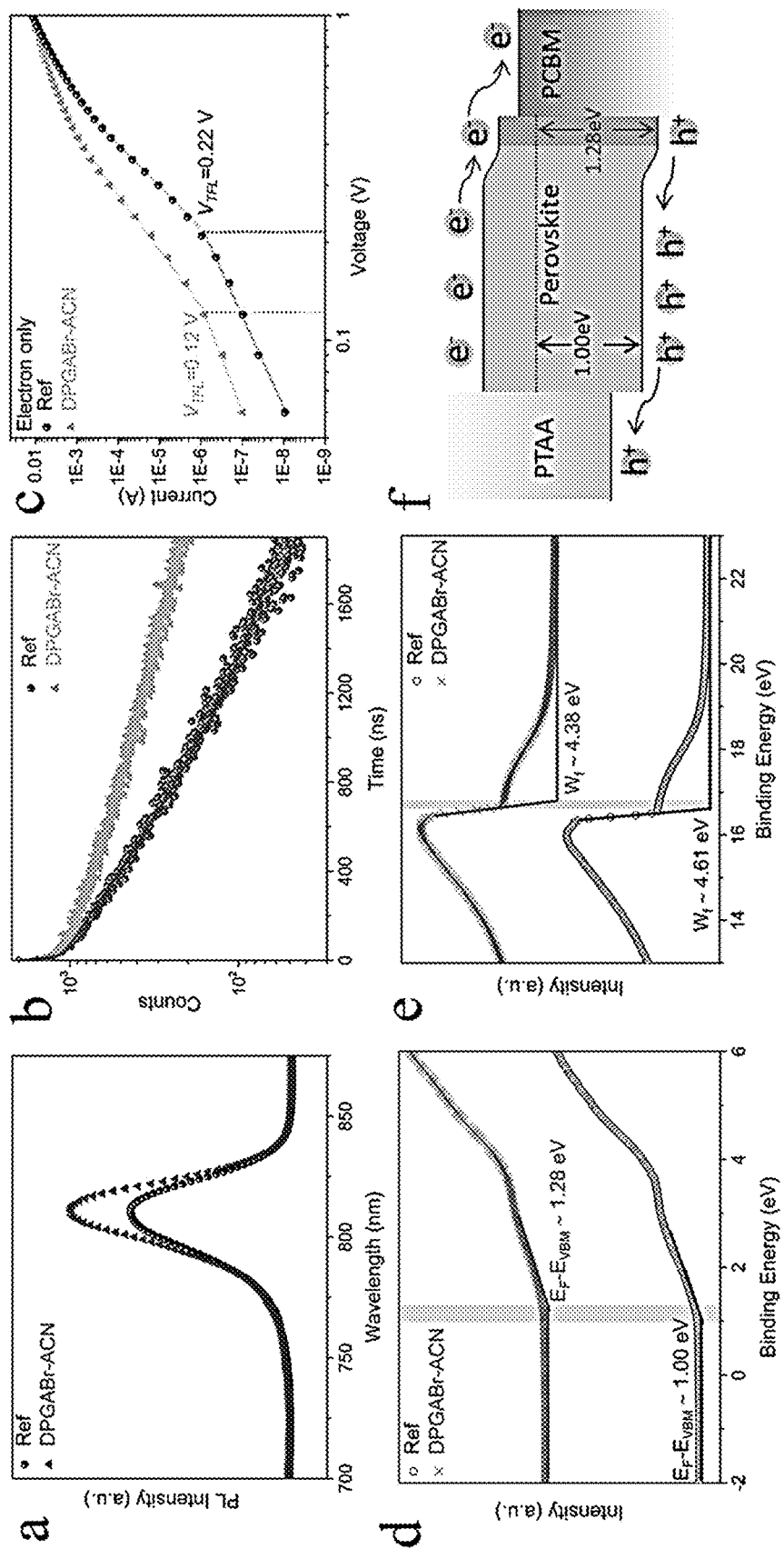
FIG. 8 shows (a) Steady-state PL and (b) TRPL spectra of perovskite films with and without DPGABr treatment. (c) Dark I-V curves for the electron-only devices with the structure of $ITO/SnO_2/MA_{0.7}FA_{0.3}PbI_3/PC70BM/Ag$. (d, e) UPS spectra of perovskites with and without DPGABr-ACN treatment. (f) Energy level alignment of $MA_{0.7}FA_{0.3}PbI_3$ PSCs with DPGABr-ACN treatment.

Photoluminescence (PL) measurements on perovskite films with and without surface reconstruction were conducted to evaluate the passivation effects. The test was performed with a glass/perovskite structure and excited from the perovskite side with 435 nm excitation. FIG. 8a shows that both films emit infrared light within a wavelength range of approximately 750 nm to 840 nm, indicating that the incorporation of DPGABr into the perovskite film surface has little impact on the radiative recombination mechanism. However, the DPGABr-ACN treated perovskite film exhibited a stronger PL intensity, suggesting a reduction in non-radiative recombination centers on the surface. This inference is supported by the time-resolved PL (TRPL) results shown in FIG. 8b. The data was fitted with a biexponential decay function and calculated the average lifetime $\tau_{ave}$ using the following equation [37]:

$$\tau_{ave} = \frac{\sum A_i \tau_i^2}{\sum A_i \tau_i}$$

The resulting $\tau_{ave}$ for the reference perovskite films and DPGABr-ACN film was found to be 452 and 791 ns, respectively. The increased $\tau_{ave}$ indicates a reduction in non-radiative recombination centers on the perovskite surface after surface reconstructions, which is favorable for improving the photovoltaic performance of PSCs.

To investigate the trap density in the perovskite films, space charge-limited current (SCLC) tests were conducted, and the inset of FIG. 8c shows the electron-only device with a structure of $ITO/SnO_2/perovskite/PC70BM/Ag$. FIG. 8c demonstrates a trap-filled limit voltage ($V_{TFL}$) of 0.22 V for the reference device and a lower $V_{TFL}$ of 0.12 V for the DPGABr-ACN treated device. The trap density ($N_t$) was calculated using the equation [38]:

$$N_t = \frac{2 V_{TFL} \varepsilon_r \varepsilon_0}{qL^2}$$

Figure 9:
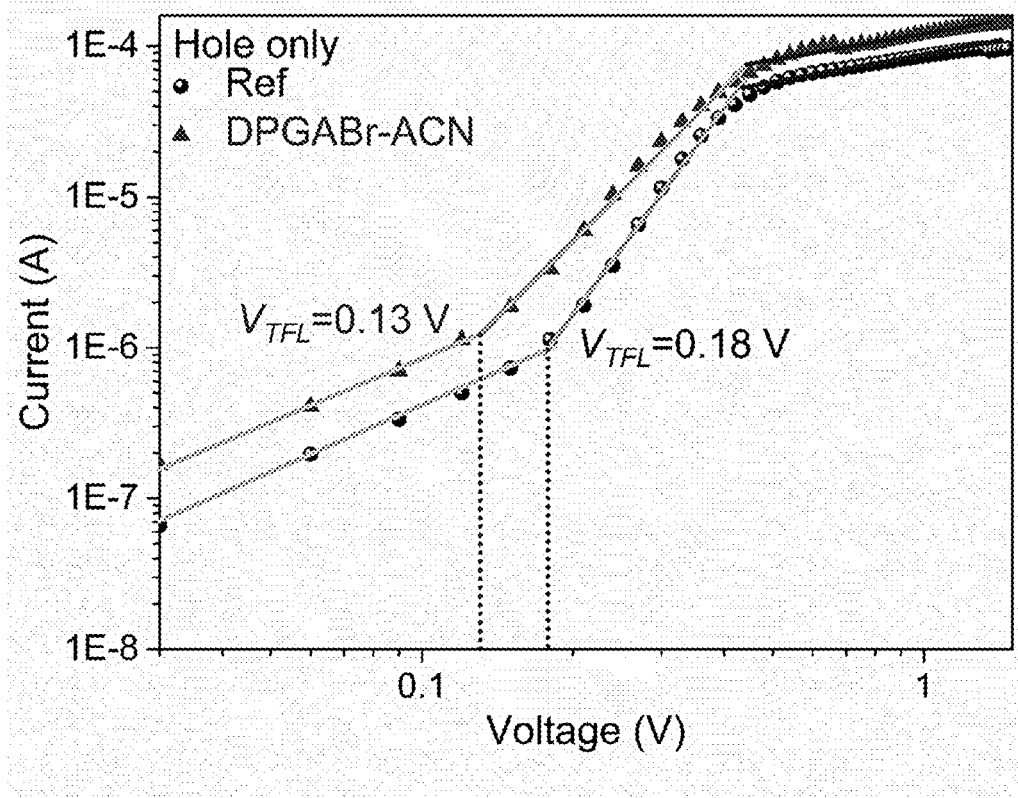
FIG. 9 shows dark I-V curves for the hole-only devices with the structure of $ITO/PTAA/MA_{0.7}FA_{0.3}PbI_3/Spiro-OMeTAD/Au$.

L represents the thickness of the perovskite film, $\varepsilon_r$ represents the relative dielectric constant of the perovskite, co represents the vacuum permittivity, and q represents the electron charge. The resulting trap densities for the perovskite with and without DPGABr-ACN treatment are $0.87 \times 10^{15}$ cm$^{-3}$ and $1.61 \times 10^{15}$ cm$^{-3}$, respectively. The test based on the hole-only device shown in FIG. 9 shows a similar result, with a reduction in $N_t$ after DPGABr-ACN treatment from $1.32 \times 10^{15}$ cm$^{-3}$ to $0.95 \times 10^{15}$ cm$^{-3}$. The decrease in trap density observed in the DPGABr-ACN treated film highlights the potential of surface reconstruction in achieving a higher-quality film surface, which is essential for improving $V_{OC}$ in PSCs.

Figure 10:
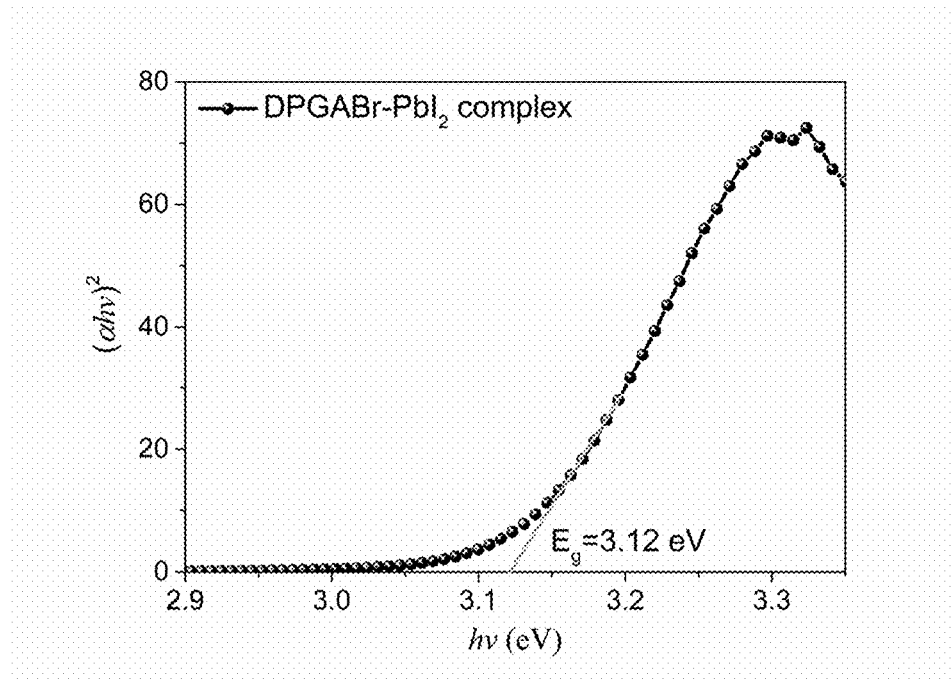
FIG. 10 shows Tauc plots for $DPGABr/PbI_2$ complex film.

According to the light absorption spectrum of the DPGABr:$PbI_2$ complex layer, the absorption edge is 397 nm (See supporting information FIG. 10), corresponding to the bandgap energy of 3.12 eV, indicating that the complex layer is an insulator. The coverage of the insulator partially on the perovskite surface may passivate traps while charge transfer will not be influenced, which is similar to the previous reports on the effect of an ultrathin poly(methyl methacrylate) (PMMA) interlayer in improving the performance of PSCs [39, 40].

Figure 11:
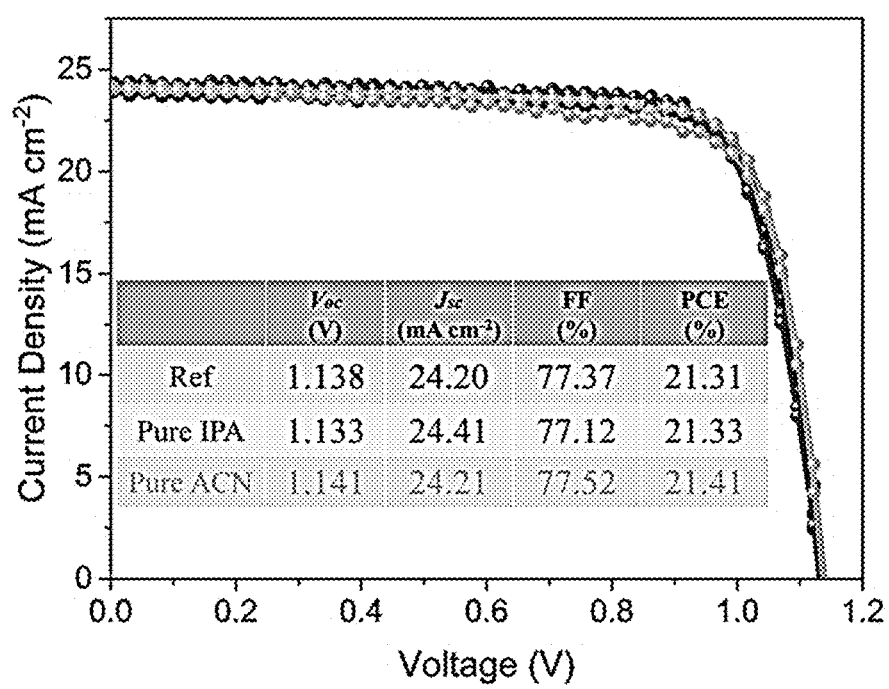
FIG. 11 shows J-V curves of PSCs with different pure IPA and ACN treatment. Inset is the performance parameters.

To develop a deeper understanding of charge transfer after surface reconstruction, the energy level alignment of the perovskite films was analysed by conducting ultraviolet photoelectron spectroscopy (UPS). FIGS. 8d and e present the values of $E_f$-$E_{VBM}$ and work functions ($W_f$), respectively, which were extracted from the cutoff of the linear extension line. The results indicate that the gap between $E_f$ and $E_{VBM}$ becomes wider after the surface reconstruction, suggesting that the surface of the film is more n-type and that the number of free electrons at the surface increases [41]. The increase of $W_f$ from 4.61 to 4.38 eV at the surface induces a built-in electric field with the bulk, promoting charge separation and transfer under light illumination [42, 43]. According to the values of $E_f$-$E_{VBM}$, $W_f$, and band gap ($E_g$) extracted from Tauc plots (FIG. 11), the positions of the valence band ($E_v$) and conduction band ($E_c$) can be determined. The energy level alignment of the device is shown in FIG. 8f, from which the charge transfer characteristic can be analyzed. The energy gap between $E_c$ of the perovskite and PCBM provides sufficient driving force (~0.11 eV) for electron transfer. More importantly, the band bending at the perovskite surface is favourable for charge transfer when photo carriers are generated under light illumination.

Photovoltaic Properties of DPGABr-Treated PSCs

Figure 12:
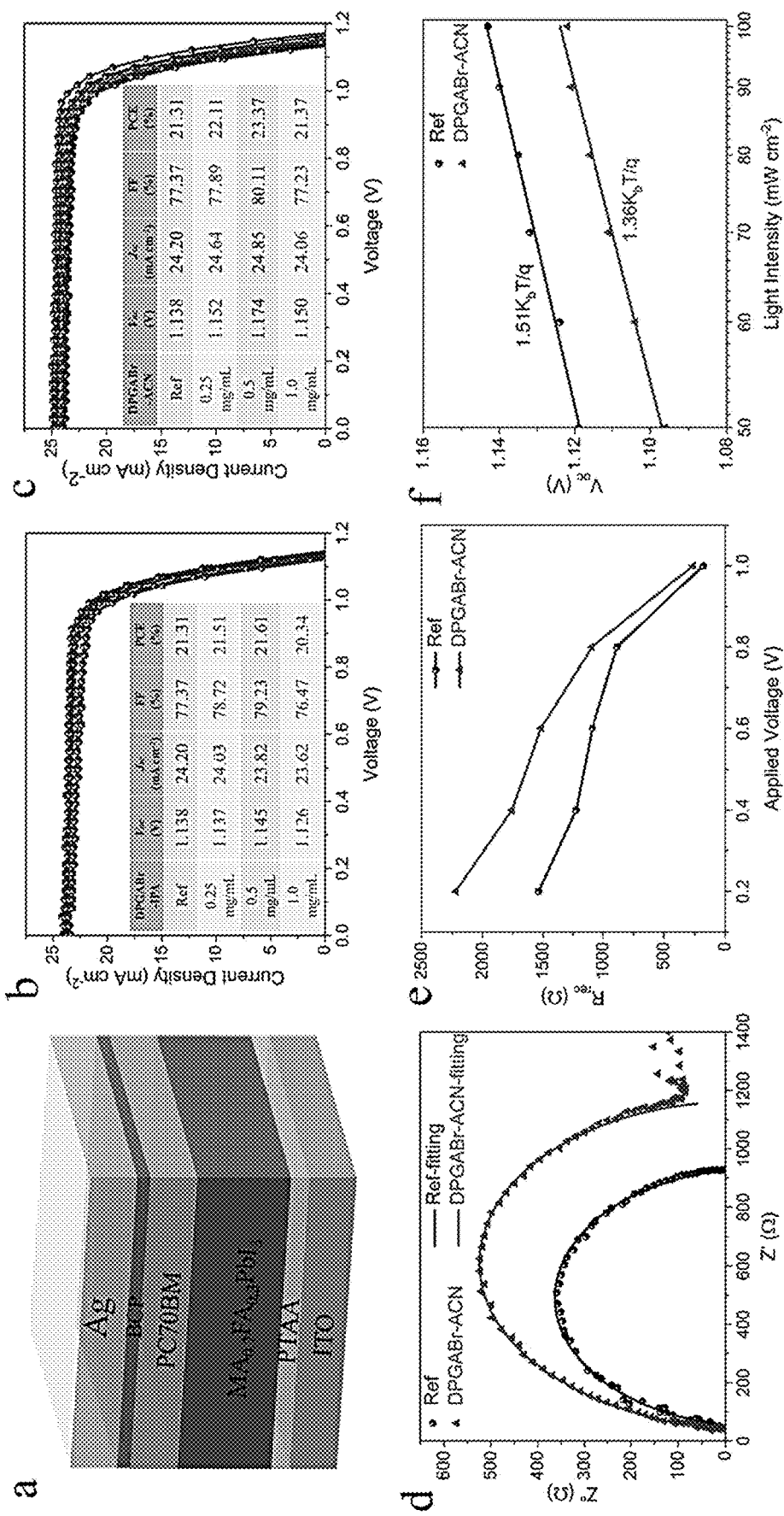
FIG. 12 shows (a) Device structure of PSC. J-V curves of PSCs with different concentrations of (b) DPGABr-IPA treatment and (c) DPGABr-ACN treatment. Inset is the performance parameters. (d) EIS of $MA_{0.7}FA_{0.3}PbI_3$ PSCs measured at a bias voltage of 0.80 V under light illumination of 100 mW cm$^{-2}$. (e) The $R_{rec}$ of the $MA_{0.7}FA_{0.3}PbI_3$ PSCs derived from EIS at various voltages under light illumination of 100 mW cm$^{-2}$. (f) $V_{oc}$ as a function of light intensity for the PSCs with and without DPGABr-ACN treatment.
Figure 13:
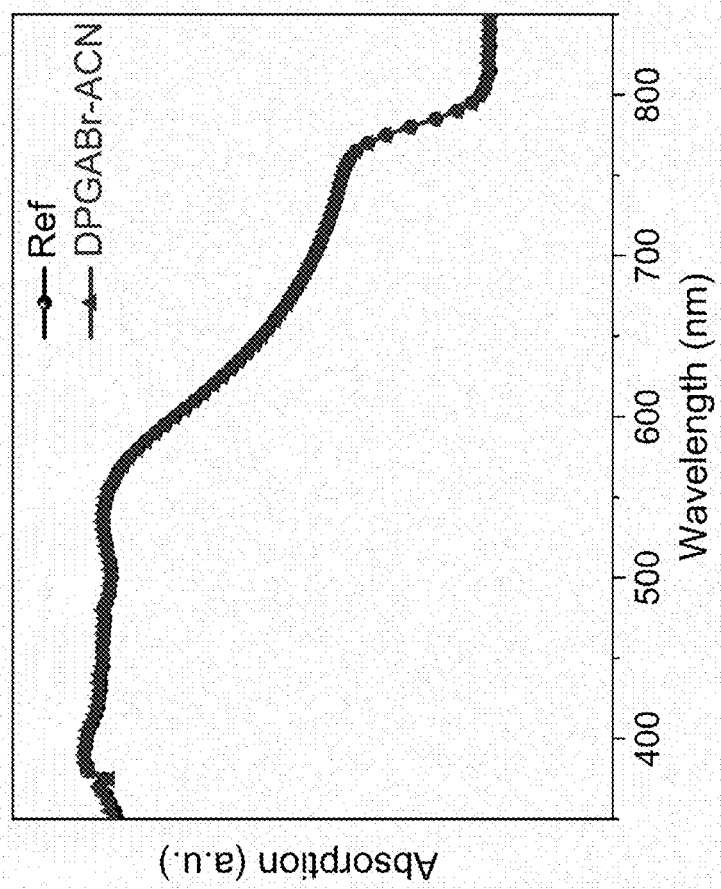
FIG. 13 shows absorption spectra of perovskite films with and without DPGABr-ACN.

To explore the effect of different post-treatment on photovoltaic performance, PSCs with a structure of ITO/PTAA/ $MA_{0.7}FA_{0.3}PbI_3$/$PC_{70}BM$/BCP/Ag (FIG. 12a) modified with DPGABr-IPA and DPGABr-ACN respectively were fabricated. The results in FIG. 12b show that DPGABr-IPA treatment had a negligible impact on the PCE of PSCs. However, as seen in FIG. 12c, DPGABr-ACN treatment significantly improved the PCE from 21.31% to 22.65%, along with an enhanced $V_{oc}$ of 1.15V, short-circuit current ($J_{sc}$) of 24.92 mA cm$^{-2}$, and fill factor (FF) of 79.14%. These findings suggest that specific surface reconstruction can enhance the photovoltaic performance of PSCs, which depends on the choice of post-treatment solvent and surface modifiers. To demonstrate that the difference in photovoltaic performance is caused by surface reconstruction rather than pure solvent effects, the PSCs modified with two different pure solvents were fabricated. As shown in FIG. 13, surface treatment with pure solvent did not significantly improve the photovoltaic performance of the devices.

Figure 14:
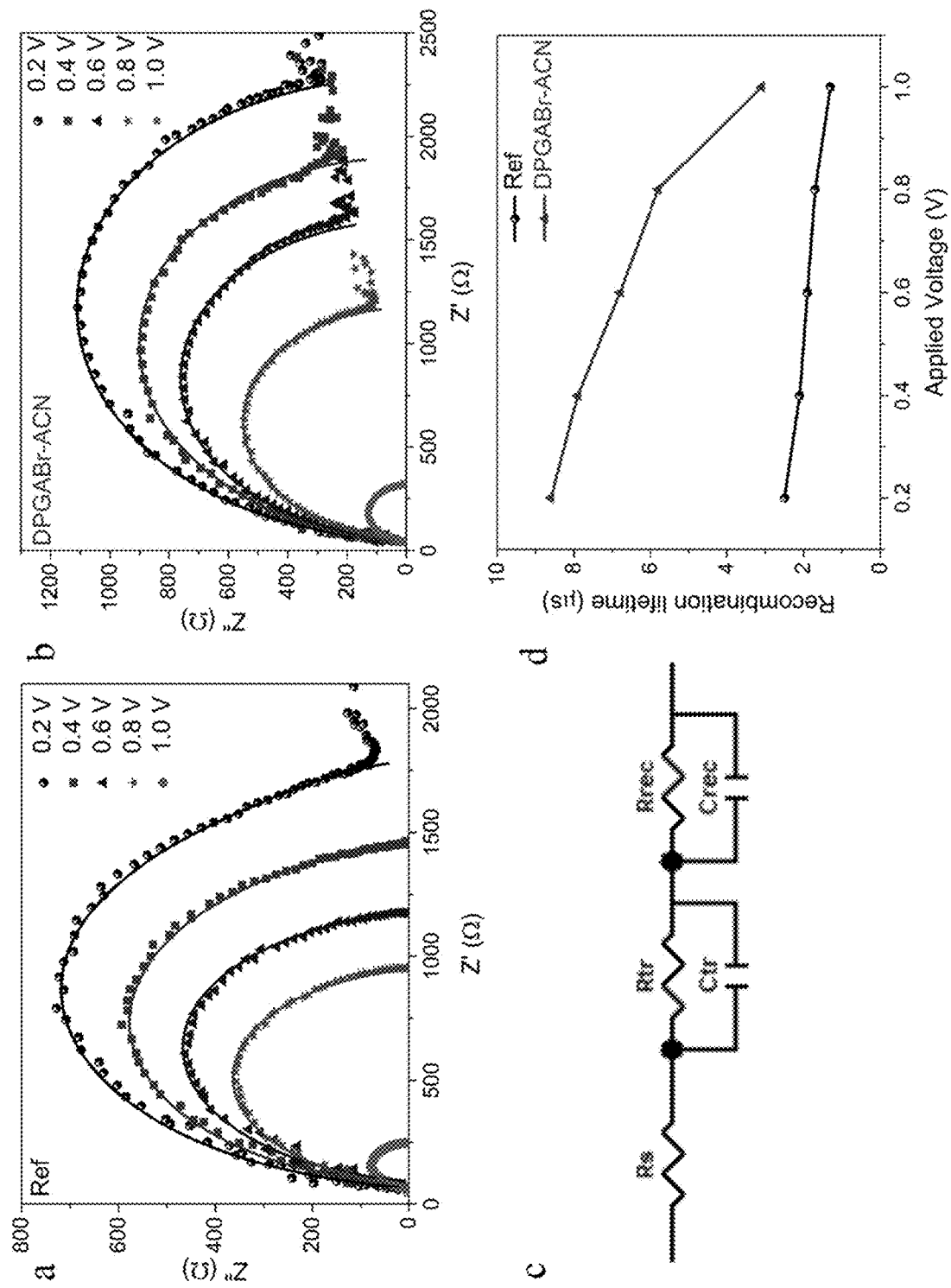
FIG. 14 shows electrochemical impedance spectra (EIS) of PSCs measured at different voltage under light illumination of 100 mW cm$^{-2}$: (a) reference PSC, (b) DPGABr-ACN-treated PSC. (c) The equivalent circuit diagram for EIS measurements. (d) Recombination lifetime at different bias obtained from EIS on devices with or without DPGABr-ACN.

To gain further insight into the underlying mechanisms of charge transport and recombination in the PSCs, electrochemical impedance spectroscopy (EIS) was employed. FIG. 12d shows the Nyquist plots measured at a bias voltage of 0.80 V under light illumination of 100 mW cm$^{-2}$. The equivalent circuit model shown in FIG. 14c was used to obtain the charge transfer resistance ($R_{tr}$) and recombination resistance ($R_{rec}$). Generally, the high-frequency component represents $R_{tr}$, while the low-frequency component represents $R_{rec}$ [44]. Specifically, a decrease in $R_{tr}$ from 55.38 to 26.68Ω, as well as an increase in $R_{rec}$ from 885.4 to 1094Ω for devices before and after the DPGABr-ACN treatment were observed. These findings suggest that surface reconstruction led to faster charge transport and reduced nonradiative recombination at the perovskite/PCBM interface, which is beneficial for $J_{sc}$ and $V_{oc}$ of PSCs. In FIG. 12e, $R_{rec}$ values at various applied voltages under a light intensity of 100 mW cm$^{-2}$ are presented. It can be observed that the target device shows higher $R_{rec}$ than that of the control at every bias voltage. This finding provides strong evidence that surface reconstruction can significantly reduce recombination rate in the PSCs due to the defect passivation by DPGABr. The increased $R_{rec}$ is expected to enhance the shunt resistance of PSCs, which is a key factor contributing to the observed improvement in the FF of the target PSC [45].

Figure 15:
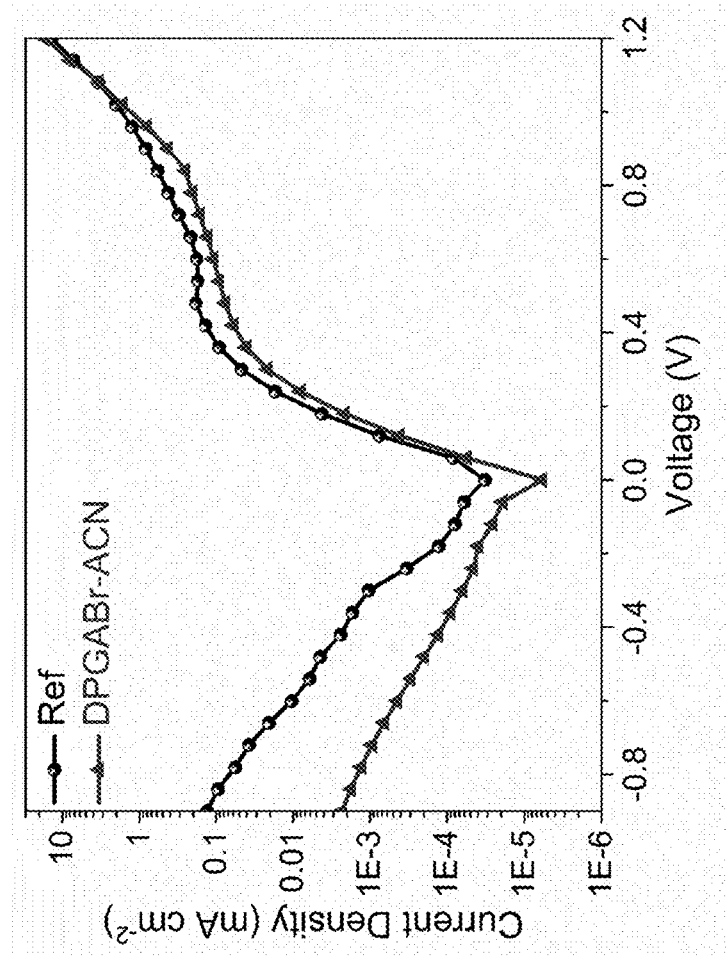
FIG. 15 shows dark J-V curves of the PSCs with and without DPGABr-ACN treatment.

FIG. 12f shows the dependence of $V_{oc}$ on light intensity in PSCs with and without DPGABr-ACN treatment. The corresponding slopes for the target and control devices were determined to be 1.36 KT/q and 1.51 KT/q, respectively. Generally, a larger deviation from the ideal slope of 1 KT/q suggests the presence of more trap-assisted recombination centers. The lower slope observed in the DPGABr-CAN treated PSC indicates that non-radiative recombination was effectively suppressed. In addition, dark I-V curve measurements were carried out to examine the reverse saturation current density of PSCs. As shown in FIG. 15, the target PSC exhibits a lower reverse saturation current density than the control device, indicating that carrier generation rate in the dark is lower in the former due to lower trap density [46]. This result is consistent with the suppressed recombination rate in the target PSCs.

After a successful passivation of surface defects and a formation of a more n-type perovskite surface, a champion device with a remarkable PCE of 23.37%, $V_{oc}$ of 1.174 V, $J_{sc}$ of 24.85 mA cm$^{-2}$, and FF of 80.11% (FIG. 16a) was achieved. In addition, external quantum efficiency (EQE) measurements (FIG. 16b) show that the integrated photocurrent of the champion device is 23.67 mA cm$^{-2}$, which is consistent with the $J_{sc}$ value obtained from the J-V curves. Notably, a maximum PCE of 20.44% for DPGABr-ACN-treated devices with a device area of 1 cm$^2$ (FIG. 16c) was obtained. These results demonstrate the effectiveness of DPGABr-ACN post-treatment in achieving high-performance PSCs.

Figure 16:
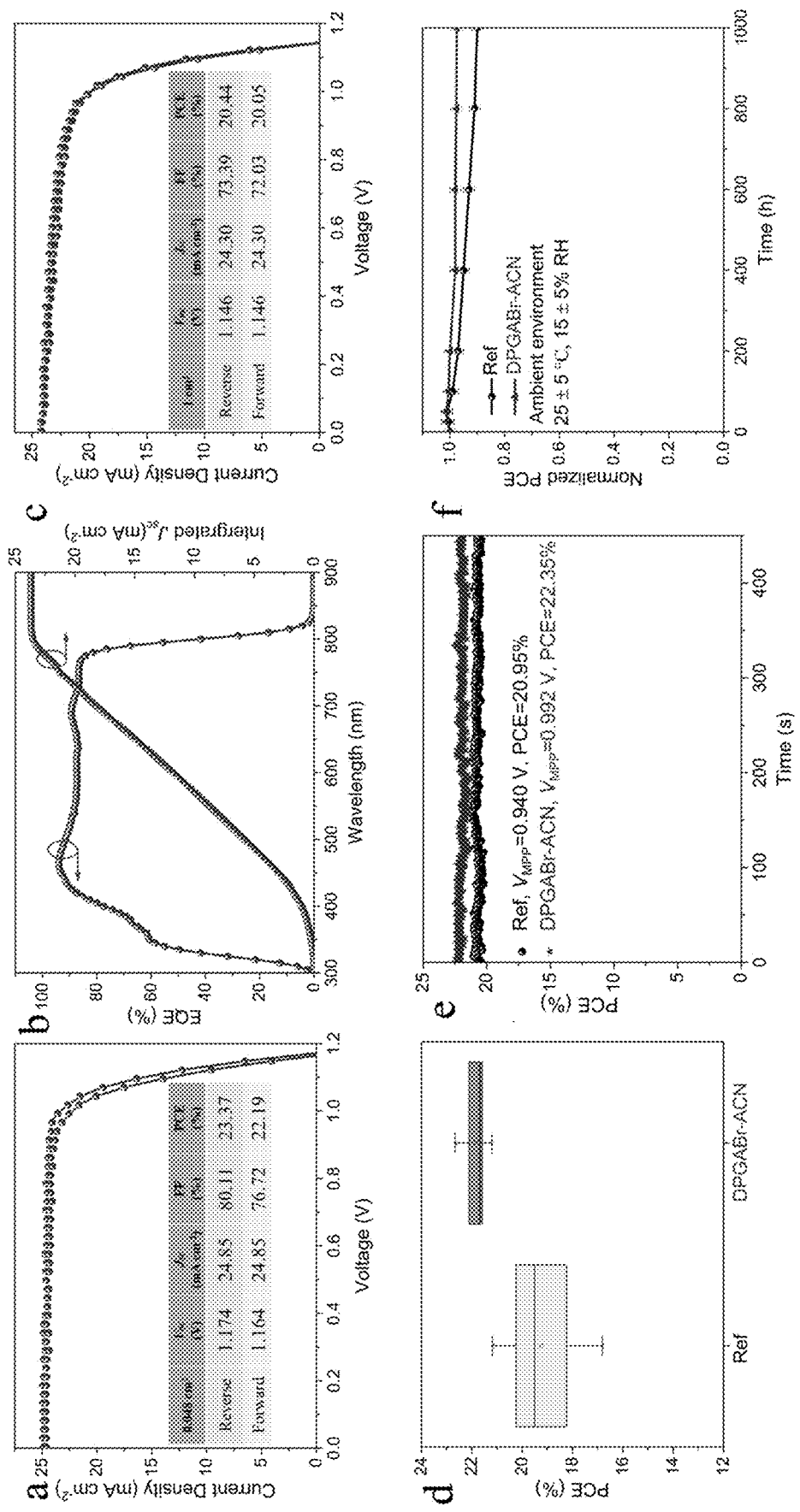
FIG. 16 shows (a) J-V curves of the champion PSC with DPGABr-ACN treatment. Inset is the performance parameters. (b) EQE spectra of the champion PSC with DPGABr-ACN treatment. (c) J-V curves of the DPGABr-ACN treated PSC with 1 cm$^2$ area. (d) The statistics of PCE for PSCs with and without DPGABr-ACN. (e) MPP tracking for PSCs under continuous AM 1.5 G illumination. (f) Long-term stability of the PSCs under ambient environment.
Figure 17:
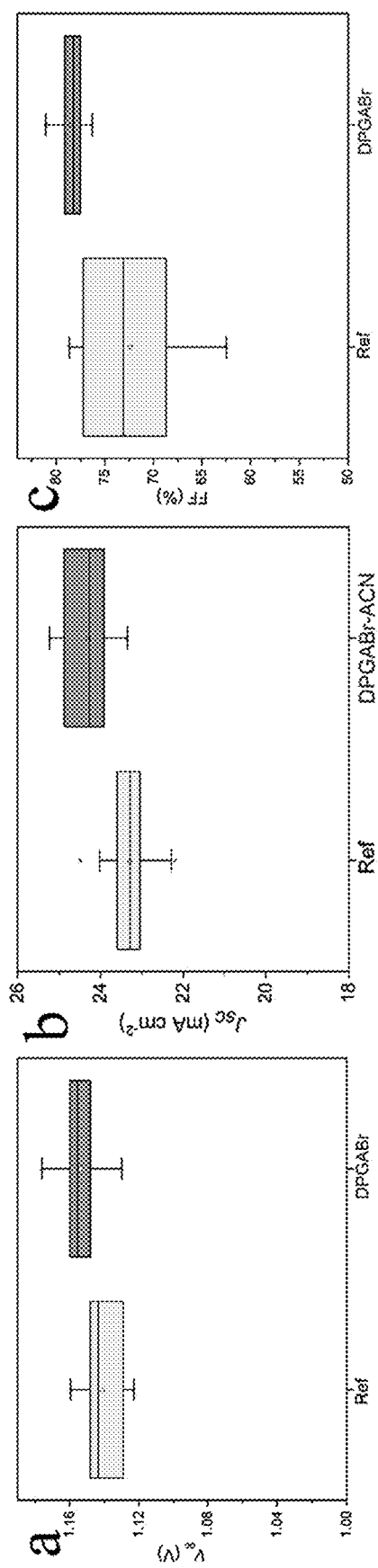
FIG. 17 shows the statistics of performance parameters for devices with and without DPGABr-ACN: (a) $V_{oc}$, (b) $J_{sc}$, and (c) FF.

To assess the repeatability of DPGABr-ACN post-treatment, 30 devices in the same batch were fabricated respectively to evaluate their performance. FIG. 16d shows that DPGABr-ACN-based devices outperform the reference devices in terms of average PCE, as well as improvements in the average values of $V_{oc}$, $J_{sc}$, and FF (FIG. 17). The operational stability of PSCs was also evaluated by measuring their steady-state output at the maximum power point (MPP). In FIG. 16e, the results indicate that the PSC treated with DPGABr-ACN exhibits a higher output PCE of 22.35% at the $V_MPP$ of 0.992 V, compared to the control device with a PCE of 20.95% at the applied voltage of 0.94 V. Notably, both devices maintained a stable output during operation. In addition, long-term stability of PSCs is crucial to practical applications. FIG. 16f depicts the long-term stability of the unencapsulated PSCs under ambient conditions (25±5° C., 15%±5% RH). The target device with surface reconstruction exhibits superior stability compared to the control one, which can be attributed to the significantly reduced trap density on the perovskite surface.

CONCLUSION

In summary, a facile surface modification approach by removing the partial surface MAI/FAI component and reconstructing the surface with the aid of DPGABr to achieve efficient blade-coating PSCs is presented. In contrast to IPA, ACN can dissolve and remove MAI/FAI quickly on the perovskite surface and lead to the exposure of $PbI_2$. With the addition of DPGABr in ACN, the reconstruction process on the perovskite surface is achieved by the reaction between $PbI_2$ termination and DPGABr, yielding an amorphous complex that partially covers the perovskite surface. It was found that the DPGABr:$PbI_2$ complex layer can passivate defects and tune the perovskite surface to be more n-type. Consequently, the devices after the treatment show higher PCE with a relative enhancement of 6% and the champion device shows a PCE of 23.37% with a $V_{oc}$ of 1.174V. This work provides a novel strategy for surface reconstruction of perovskite films by blade-coating, compatible with upscaling manufacture of large-area PSCs and other optoelectronic devices.

REFERENCES

[1] A. Kojima, K. Teshima, Y. Shirai, T. Miyasaka, J. Am. Chem. Soc. 2009, 131, 6050.

[2] A. Mei, X. Li, L. Liu, Z. Ku, T. Liu, Y. Rong, M. Xu, M. Hu, J. Chen, Y. Yang, M. Grätzel, H. Han, Science 2014, 345, 295.
[3] Z. Xiao, Q. Dong, C. Bi, Y. Shao, Y. Yuan, J. Huang, Adv. Mater. 2014, 26, 6503.
[4] J. H. Heo, D. H. Song, H. J. Han, S. Y. Kim, J. H. Kim, D. Kim, H. W. Shin, T. K. Ahn, C. Wolf, T. W. Lee, S. H. Im, Adv. Mater. 2015, 27, 3424.
[5] N. J. Jeon, J. H. Noh, W. S. Yang, Y. C. Kim, S. Ryu, J. Seo, S. I. Seok, Nature 2015, 517, 476.
[6] Y. Deng, E. Peng, Y. Shao, Z. Xiao, Q. Dong, J. Huang, Energy Environ. Sci. 2015, 8, 1544.
[7] Y. Deng, Q. Dong, C. Bi, Y. Yuan, J. Huang, Adv. Energy Mater. 2016, 6, 1600372.
[8] Y. Zhong, R. Munir, J. Li, M.-C. Tang, M. R. Niazi, D.-M. Smilgies, K. Zhao, A. Amassian, ACS Energy Lett. 2018, 3, 1078.
[9] P. W.-K. Fong, H. Hu, Z. Ren, K. Liu, L. Cui, T. Bi, Q. Liang, Z. Wu, J. Hao, G. Li, Adv. Sci. 2021, 8, 2003359.
[10] J. Hidalgo, C. A. R. Perini, A.-F. Castro-Mendez, D. Jones, H. Köbler, B. Lai, R. Li, S. Sun, A. Abate, J.-P. Correa-Baena, ACS Energy Lett. 2020, 5, 3526.
[11] S. Chen, X. Dai, S. Xu, H. Jiao, L. Zhao, J. Huang, Science 2021, 373, 902.
[12] S. Chen, X. Xiao, H. Gu, J. Huang, Sci. Adv. 7, eabe8130.
[13] G. Wang, Q. Lian, D. Wang, F. Jiang, G. Mi, D. Li, Y. Huang, Y. Wang, X. Yao, R. Shi, Adv. Mater. 2022, 34, 2205143.
[14] P. W. K. Fong, H. Hu, Z. Ren, K. Liu, L. Cui, T. Bi, Q. Liang, Z. Wu, J. Hao, G. Li, Adv. Sci. 2021, 8, 2003359.
[15] H. Li, X. Feng, K. Huang, S. Lu, X. Wang, E. Feng, J. Chang, C. Long, Y. Gao, Z. Chen, C. Yi, J. He, J. Yang, Small 2023, n/a, 2300374.
[16] Y. Chen, X. Liu, Y. Zhao, Angew. Chem. Int. Ed. 2022, 61, e202110603.
[17] J. A. Aguiar, S. Wozny, N. R. Alkurd, M. Yang, L. Kovarik, T. G. Holesinger, M. Al-Jassim, K. Zhu, W. Zhou, J. Berry, ACS Energy Lett. 2016, 1, 155.
[18] S. Pathak, A. Sepe, A. Sadhanala, F. Deschler, A. Haghighirad, N. Sakai, K. C. Goedel, S. D. Stranks, N. Noel, M. Price, ACS Nano 2015, 9, 2311.
[19] Q. Jiang, Y. Zhao, X. Zhang, X. Yang, Y. Chen, Z. Chu, Q. Ye, X. Li, Z. Yin, J. You, Nat. Photonics 2019, 13, 460.
[20] D. Luo, X. Li, A. Dumont, H. Yu, Z. H. Lu, Adv. Mater. 2021, 33, 2006004.
[21] G. Wu, R. Liang, M. Ge, G. Sun, Y. Zhang, G. Xing, Adv. Mater. 2022, 34, 2105635.
[22] Q. Jiang, J. Tong, Y. Xian, R. A. Kerner, S. P. Dunfield, C. Xiao, R. A. Scheidt, D. Kuciauskas, X. Wang, M. P. Hautzinger, R. Tirawat, M. C. Beard, D. P. Fenning, J. J. Berry, B. W. Larson, Y. Yan, K. Zhu, Nature 2022, 611, 278.
[23] Z. Li, B. Li, X. Wu, S. A. Sheppard, S. Zhang, D. Gao, N. J. Long, Z. Zhu, Science 2022, 376, 416.
[24] M. Yang, T. Zhang, P. Schulz, Z. Li, G. Li, D. H. Kim, N. Guo, J. J. Berry, K. Zhu, Y. Zhao, Nat. Commun. 2016, 7, 12305.
[25] F. Li, X. Deng, F. Qi, Z. Li, D. Liu, D. Shen, M. Qin, S. Wu, F. Lin, S.-H. Jang, J. Zhang, X. Lu, D. Lei, C.-S. Lee, Z. Zhu, A. K. Y. Jen, J. Am. Chem. Soc. 2020, 142, 20134.
[26] S. Chen, Y. Liu, X. Xiao, Z. Yu, Y. Deng, X. Dai, Z. Ni, J. Huang, Joule 2020, 4, 2661.
[24] Y. Yang, W. Zhao, T. Yang, J. Liu, J. Zhang, Y. Fang, S. Liu, J. Mater. Chem. A 2021, 9, 23597.
[2] Y. Deng, C. H. Van Brackle, X. Dai, J. Zhao, B. Chen, J. Huang, Sci. Adv. 2019, 5, eaax7537.
[29] S. Sidhik, Y. Wang, M. De Siena, R. Asadpour, A. J. Torma, T. Terlier, K. Ho, W. Li, A. B. Puthirath, X. Shuai, A. Agrawal, B. Traore, M. Jones, R. Giridharagopal, P. M. Ajayan, J. Strzalka, D. S. Ginger, C. Katan, M. A. Alam, J. Even, M. G. Kanatzidis, A. D. Mohite, Science 2022, 377.
[30] J. Zhu, S. Park, O. Y. Gong, C. Sohn, Z. Li, Z. Zhang, B. Jo, W. Kim, G. S. Han, D. H. Kim, T. K. Ahn, J. Lee, H. S. Jung, Energy Environ. Sci. 2021, 14, 4903.
[31] X. Li, M. Ibrahim Dar, C. Yi, J. Luo, M. Tschumi, S. M. Zakeeruddin, M. K. Nazeeruddin, H. Han, M. Grätzel, Nature Chemistry 2015, 7, 703.
[32] T. Yang, L. Gao, J. Lu, C. Ma, Y. Du, P. Wang, Z. Ding, S. Wang, P. Xu, D. Liu, H. Li, X. Chang, J. Fang, W. Tian, Y. Yang, S. Liu, K. Zhao, Nat. Commun. 2023, 14, 839.
[33] S. Tan, T. Huang, I. Yavuz, R. Wang, M. H. Weber, Y. Zhao, M. Abdelsamie, M. E. Liao, H.-C. Wang, K. Huynh, K.-H. Wei, J. Xue, F. Babbe, M. S. Goorsky, J.-W. Lee, C. M. Sutter-Fella, Y. Yang, J. Am. Chem. Soc. 2021, 143, 6781.
[34] H. Cheng, C. Liu, J. Zhuang, J. Cao, T. Wang, W. Y. Wong, F. Yan, Adv. Funct. Mater. 2022, 32, 2204880.
[35] R. Yu, G. Wu, R. Shi, Z. Ma, Q. Dang, Y. Qing, C. Zhang, K. Xu, Z. a. Tan, Adv. Energy Mater. 2023, 13, 2203127.
[36] J. Cao, C.-K. Liu, V. Piradi, H.-L. Loi, T. Wang, H. Cheng, X. Zhu, F. Yan, ACS Energy Lett. 2022, 7, 3362.
[34] J. Zhuang, P. Mao, Y. Luan, N. Chen, X. Cao, G. Niu, F. Jia, F. Wang, S. Cao, J. Wang, Adv. Funct. Mater. 2021, 31, 2010385.
[38] J. Cao, H.-L. Loi, Y. Xu, X. Guo, N. Wang, C.-k. Liu, T. Wang, H. Cheng, Y. Zhu, M. G. Li, W.-Y. Wong, F. Yan, Adv. Mater. 2022, 34, 2107729.
[39] H. Kim, K. S. Lee, M. J. Paik, D. Y. Lee, S.-U. Lee, E. Choi, J. S. Yun, S. I. Seok, Adv. Funct. Mater. 2022, 32, 2110473.
[40] B. Yuan, C. Li, W. Yi, F. Juan, H. Yu, F. Xu, C. Li, B. Cao, J. Phys. Chem. Solids 2021, 153, 110000.
[41] Y.-N. Lu, J.-X. Zhong, Y. Yu, X. Chen, C.-Y. Yao, C. Zhang, M. Yang, W. Feng, Y. Jiang, Y. Tan, L. Gong, X. Wei, Y. Zhou, L. Wang, W.-Q. Wu, Energy Environ. Sci. 2021, 14, 4048.
[42] W. Yan, Y. Li, Y. Li, S. Ye, Z. Liu, S. Wang, Z. Bian, C. Huang, Nano Energy 2015, 16, 428.
[43] W. Chai, W. Zhu, Z. Zhang, D. Liu, Y. Ni, Z. Song, P. Dong, D. Chen, J. Zhang, C. Zhang, Y. Hao, Chem. Eng. J. 2023, 452, 139292.
[44] H. Li, J. Cao, Q. Zhou, L. Ding, J. Wang, Nano Energy 2015, 15, 125.
[45] P. You, G. Li, G. Tang, J. Cao, F. Yan, Energy Environ. Sci. 2020, 13, 1187.
[46] T. Wu, P. Xu, D. Wang, X. Jiang, F. Guo, S. Gao, Z. Ge, Y. Zhang, Chem. Eng. J. 2023, 454, 140451.

What is claimed is:

1. A perovskite with a modified surface, wherein:
   a. said perovskite is a mixed-cation lead halide perovskite; and
   b. said modified surface comprises a DPGABr:PbI$_2$ complex layer.

2. The perovskite of claim 1, wherein said perovskite comprises MA$_{(1-x)}$FA$_x$PbI$_3$ with $0 \leq x \leq 1$.

3. The perovskite of claim 1, wherein said perovskite comprises one or more selected from the group consisting of MA$_{0.7}$FA$_{0.3}$PbI$_3$, MAPbI$_3$ and FAPbI$_3$.

4. The perovskite of claim 1, wherein said modified surface exhibits one or more photovoltaic properties selecting from the group consisting of:
   a. a PCE of >20%;
   b. a $V_{oc}$ of >1.1V;
   c. a $J_{sc}$ of >23 mA cm$^{-2}$; and
   d. a fill factor of >75%.

5. The perovskite of claim 1, wherein said modified surface is n-type as compared to an unmodified surface of said perovskite.

6. The perovskite of claim 1, wherein said modified surface is formed by the steps comprising:
   a. Providing a perovskite with a surface to be modified;
   b. Treating said surface to be modified with DPGABr; and
   c. Annealing to form said perovskite with a modified surface.

7. A perovskite solar cell, comprising the perovskite of claim 1.

8. The perovskite solar cell of claim 7, wherein said perovskite solar cell comprises a structure of ITO/PTAA/perovskite of claim 1/PC70BM/BCP/Ag.

9. A method for manufacturing a perovskite with a modified surface, comprising the steps of:
   a. Providing a perovskite with a surface to be modified;
   b. Treating said surface to be modified with DPGABr; and
   c. Annealing to form said perovskite with a modified surface;
   wherein the modified surface comprises a DPGABr:PbI$_2$ complex layer.

10. The method of claim 9, wherein said step (a) comprises blade coating a perovskite solution onto a surface.

11. The method of claim 10, wherein said perovskite solution comprises MA$_{(1-x)}$FA$_x$PbI$_3$ with 0≤x≤1.

12. The method of claim 10, wherein said perovskite solution comprises a MA$_{0.7}$FA$_{0.3}$PbI$_3$ solution.

13. The method of claim 12, wherein said MA$_{0.7}$FA$_{0.3}$PbI$_3$ solution is a 1.37 M MA$_{0.7}$FA$_{0.3}$PbI$_3$ solution formed by mixing of 2.5 M MAPbI$_3$ and 1.67 M FAPbI$_3$ followed by diluting.

14. The method of claim 12, wherein said MA$_{0.7}$FA$_{0.3}$PbI$_3$ solution further comprises 1.84 mg ml$^{-1}$ MACl, 1.15 mg ml$^{-1}$ MABr, and 2.8% v/v DMSO.

15. The method of claim 10, wherein said surface is PTAA and said blade coating is conducted with a gap of 200 m at a speed of 20 mm s$^{-1}$.

16. The method of claim 9, wherein said step (b) comprises blade coating a DPGABr solution on said surface to be modified.

17. The method of claim 16, wherein said DPGABr solution comprises DPGABr dissolved in ACN.

18. The method of claim 16, wherein said DPGABr solution has a concentration of 0.25-1.0 mg/ml.

19. The method of claim 9, wherein said step (c) comprises annealing at 100-120° C.

* * * * *